US011881404B2

(12) United States Patent
Aktas et al.

(10) Patent No.: US 11,881,404 B2
(45) Date of Patent: Jan. 23, 2024

(54) METHOD AND SYSTEM FOR DIFFUSING MAGNESIUM IN GALLIUM NITRIDE MATERIALS USING SPUTTERED MAGNESIUM SOURCES

(71) Applicant: QROMIS, Inc., Santa Clara, CA (US)

(72) Inventors: Ozgur Aktas, Pleasanton, CA (US); Vladimir Odnoblyudov, Danville, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 0 days.

(21) Appl. No.: 17/172,417

(22) Filed: Feb. 10, 2021

(65) Prior Publication Data
US 2021/0249269 A1 Aug. 12, 2021

Related U.S. Application Data

(60) Provisional application No. 62/975,075, filed on Feb. 11, 2020.

(51) Int. Cl.
*H01L 21/225* (2006.01)
*H01L 21/02* (2006.01)

(52) U.S. Cl.
CPC .... *H01L 21/2258* (2013.01); *H01L 21/02057* (2013.01)

(58) Field of Classification Search
CPC ............... H01L 21/02057; H01L 21/22; H01L 21/225–2258; H01L 21/02104; H01L 21/02365–02694
See application file for complete search history.

(56) References Cited

U.S. PATENT DOCUMENTS

| 4,111,719 A * | 9/1978 | Mader ............... H01L 21/26506 257/E21.336 |
| 4,435,610 A * | 3/1984 | Perlman ................. H01L 31/07 438/910 |
| 6,274,894 B1 * | 8/2001 | Wieczorek ........ H01L 29/66636 257/E21.409 |
| 10,134,589 B2 | 11/2018 | Odnoblyudov et al. |
| 10,297,445 B2 | 5/2019 | Odnoblyudov et al. |
| 2008/0088021 A1 * | 4/2008 | Wada ................ H01L 21/76843 438/653 |

(Continued)

OTHER PUBLICATIONS

The International Search Report and Written Opinion of the International Searching Authority in related International Application No. PCT/US2021/017434, dated Apr. 21, 2021 (nine pages).

(Continued)

*Primary Examiner* — Andres Munoz
(74) *Attorney, Agent, or Firm* — Kilpatrick Townsend & Stockton LLP

(57) ABSTRACT

A method of forming a doped gallium nitride (GaN) layer includes providing a substrate structure, including a gallium nitride layer, forming a dopant source layer over the gallium nitride layer, and depositing a capping structure over the dopant source layer. The method also includes annealing the substrate structure to diffuse dopants into the gallium nitride layer, removing the capping structure and the dopant source layer, and activating the diffused dopants.

20 Claims, 8 Drawing Sheets

(56) References Cited

U.S. PATENT DOCUMENTS

| | | | |
|---|---|---|---|
| 2008/0090395 A1* | 4/2008 | Sugimoto | H01L 29/452 |
| | | | 438/553 |
| 2008/0248639 A1 | 10/2008 | Moriyama | |
| 2009/0246924 A1 | 10/2009 | Niiyama et al. | |
| 2010/0144123 A1* | 6/2010 | Park | H01L 21/2258 |
| | | | 257/E21.135 |
| 2010/0267197 A1* | 10/2010 | Shieh | H01L 29/7869 |
| | | | 438/104 |
| 2012/0252196 A1* | 10/2012 | Clark | H01L 29/517 |
| | | | 257/E21.135 |
| 2013/0075748 A1* | 3/2013 | Bour | H01L 29/66136 |
| | | | 257/E29.093 |
| 2014/0065799 A1 | 3/2014 | Ahmed | |
| 2015/0099350 A1 | 4/2015 | Srinivasan et al. | |
| 2016/0093698 A1* | 3/2016 | Agraffeil | H01L 21/3245 |
| | | | 438/510 |
| 2016/0233108 A1 | 8/2016 | Feigelson et al. | |
| 2017/0316933 A1* | 11/2017 | Xie | H01L 29/36 |
| 2018/0047975 A1 | 2/2018 | Zhu et al. | |
| 2019/0252186 A1 | 8/2019 | Aktas et al. | |
| 2019/0393038 A1* | 12/2019 | Voss | H01L 21/28575 |

OTHER PUBLICATIONS

International Preliminary Report on Patentability dated Aug. 25, 2022 in related PCT/US2021/017434 (eight pages).

* cited by examiner

METHOD AND SYSTEM FOR DIFFUSING MAGNESIUM IN GALLIUM NITRIDE MATERIALS USING SPUTTERED MAGNESIUM SOURCES

CROSS-REFERENCES TO RELATED APPLICATIONS

This application claims priority to U.S. Provisional Patent Application No. 62/975,075, filed on Feb. 11, 2020, the disclosure of which is hereby incorporated by reference in its entirety for all purposes.

BACKGROUND OF THE INVENTION

Gallium-nitride-based semiconductor devices, such as p-n diodes, p-i-n diodes, Schottky diodes, high electron mobility transistors (HEMTs), can be applied to a variety of power systems, such as solar inverters, compact power supplies (e.g., power factor correction circuits or PFC), switch-mode power supplies (SMPS), motor drives, RF power amplifiers, solid state lighting (SSL), smart grid, and automotive motor drive systems. Accordingly, there is a need in the art for improved methods and systems related to forming gallium-nitride-based semiconductor devices.

SUMMARY OF THE INVENTION

Embodiments of the present invention relate to semiconductor materials. More particularly, methods and systems related to the use of sputtered magnesium sources for the diffusion of magnesium into gallium nitride materials are provided by embodiments of the present invention.

According to an embodiment of the present invention, a method of forming a p-type gallium nitride layer is provided. The method includes providing a substrate structure including an undoped gallium nitride layer, sputtering a dopant source including magnesium onto the undoped gallium nitride layer, and depositing a capping structure over the dopant source. The method also includes annealing the substrate structure to diffuse magnesium into the undoped gallium nitride layer, removing the capping structure and the dopant source, and activating the diffused magnesium to form the p-type gallium nitride layer.

According to another embodiment of the present invention, a method of forming a doped gallium nitride layer is provided. The method includes providing a substrate structure including a gallium nitride layer, forming a dopant source layer over the gallium nitride layer, and depositing a capping structure over the dopant source layer. The method also includes annealing the substrate structure to diffuse dopants into the gallium nitride layer, removing the capping structure and the dopant source layer, and activating the diffused dopants.

Numerous benefits are achieved by way of the present invention over conventional techniques. For example, embodiments of the present invention provide methods and systems to diffuse magnesium into GaN for device fabrication. The methods and systems described herein are applicable to a variety of optical, electronic, and opto-electronic devices. These and other embodiments of the invention, along with many of its advantages and features, are described in more detail in conjunction with the text below and attached figures.

DETAILED DESCRIPTION OF SPECIFIC EMBODIMENTS

Gallium nitride (GaN) is a widely used III-V material system suitable for a variety of optical, electronic, and opto-electronic applications. In GaN, p-type doping can be achieved by magnesium doping since magnesium is the acceptor type dopant with the smallest ionization energy. However, magnesium doping is associated with several challenges. First, passivation of magnesium dopants by hydrogen. Hydrogen creates a Mg—H complex that is neutral. Moreover, a large ionization energy (~200 meV) is associated with magnesium doping. Furthermore, if implantation is used, the implantation can create damage that is hard to anneal out due to surface decomposition. If surface decomposition occurs, this creates compensating donors at the temperature where the damage is annealed. Additionally, diffusion can be hampered by surface decomposition since surface decomposition can create compensating donors at the temperature where magnesium is known to diffuse.

The present invention relates generally to methods of forming doped regions by diffusion in gallium nitride materials. Doping refers to the process of intentionally introducing impurities into a semiconductor material in order to change its electrical properties. Doping can be achieved, for example, by either diffusion or ion implantation. In a diffusion process, a semiconductor wafer may be kept in a high temperature quartz tube furnace, and an appropriate gas mixture is passed. The dopant sources can be gaseous sources, liquid sources, or solid sources. The diffusion coefficient may depend exponentially on temperature, for example, in the form of $$D = D^0 \exp\left(-\frac{E^D}{kT}\right),$$

where k is the Boltzmann constant, T is temperature, and $E^D$ is an activation energy.

Referring to FIGS. 1-6B, a method of forming a p-type doped GaN layer (e.g., a magnesium doped GaN layer) is illustrated according to embodiments of the present invention.

Figure 1:
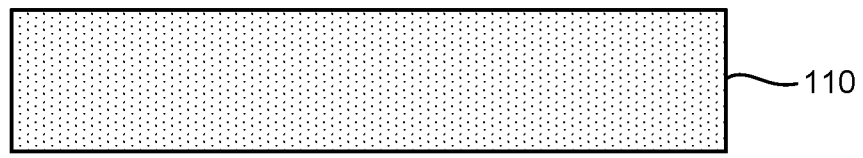
FIG. 1 is a simplified cross-sectional diagram illustrating a GaN substrate according to an embodiment of the present invention.
Figure 8:
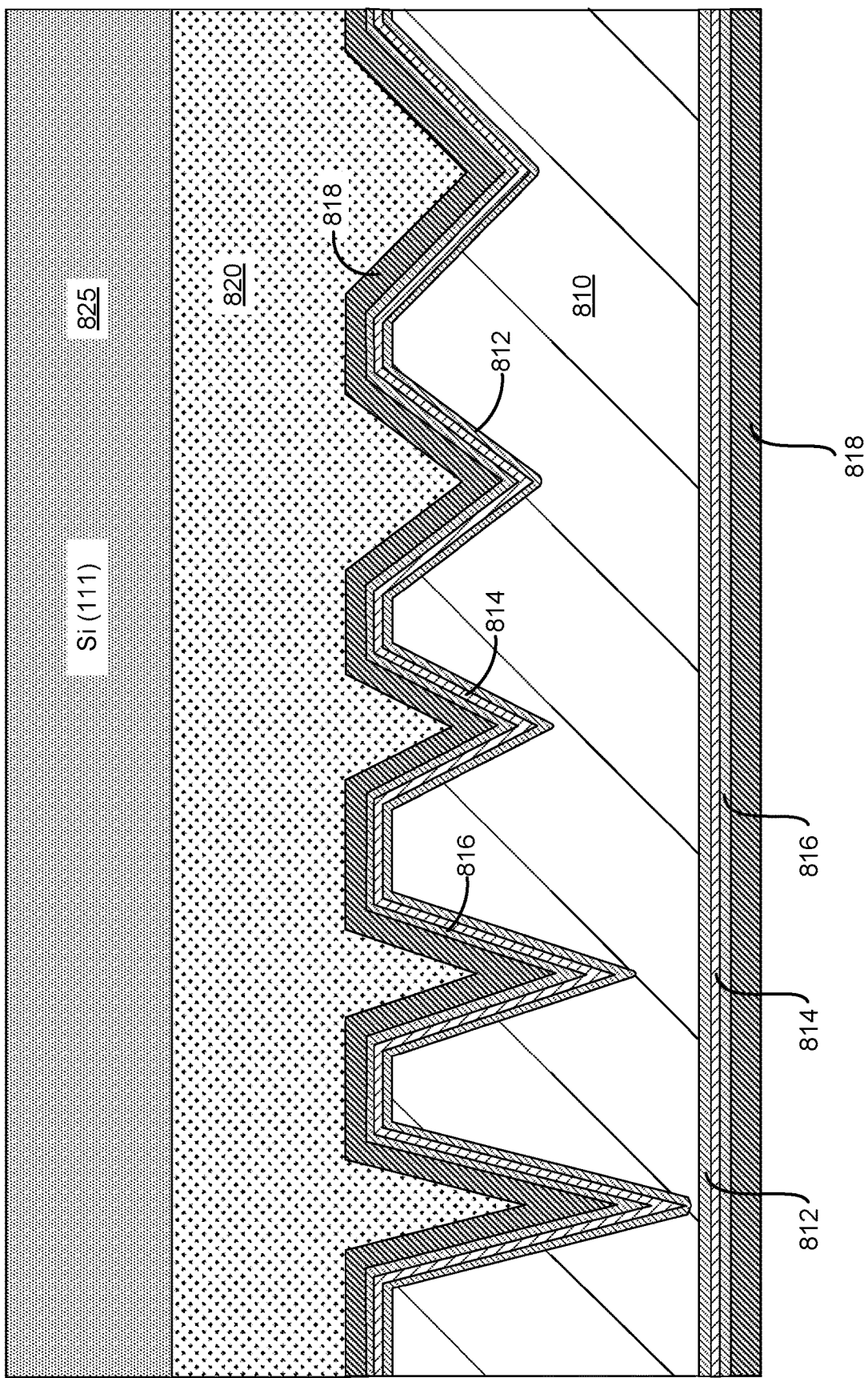
FIG. 8 is a simplified schematic diagram illustrating an engineered substrate structure according to some embodiments of the present invention.

FIG. 1 is a simplified cross-sectional diagram illustrating a GaN substrate 110 according to an embodiment of the present invention. In FIG. 1, the GaN substrate 110 may include one or more materials, e.g., an undoped or doped GaN substrate, a sapphire substrate with one or more GaN layers, a silicon carbide substrate with one or more GaN layers, a silicon substrate with one or more GaN layers, a gallium oxide substrate with one or more GaN layers, or combinations thereof. As an example, the GaN substrate 110 could include a bulk substrate, an epitaxially grown buffer layer, and an undoped GaN epitaxial layer. The GaN substrate 110 may be an engineered substrate structure as illustrated in FIG. 8. If an engineered substrate structure is utilized, it may include a ceramic-based substrate with a thin silicon (Si) layer formed thereon. Thus, the GaN substrate 110 is not limited to a bulk GaN substrate consisting of GaN, but substrates that include one or more GaN layers. The term GaN layers includes $Al_xGa_{1-x}N$ layers, where x≥0, including substrate structures that include both GaN and AlGaN layers. The various substrates described herein provide a surface for epitaxial growth.

In order to prepare the GaN substrate 110 for subsequent processing, one or more cleaning operations can be performed. As an example, an organic clean can be performed in order to remove organic residues from the growth and/or processing surface. A variety of solvents can be utilized during this cleaning process, including $H_2SO_4/H_2O_2$ or $O_2$ plasma. Furthermore, a metallic clean can be performed in order to remove metallic residues from the growth and/or processing surface. A variety of solvents can be utilized during this cleaning process, including $HCl/H_2O_2$ or HCl. Moreover, an oxide removal process can be performed in order to remove oxides present on the growth and/or processing surface. A variety of oxide removal processes can be utilized during this cleaning process, including a wet clean (HCl or HF) and/or a dry clean (e.g., using a Cl based plasma).

In some embodiments, the surface preparation process is a three-step process of organic clean, metallic clean, and then oxide removal. In other embodiments, one or more of these cleaning processes are not utilized. As described herein, the cleaning process(es) provide a pristine surface to which the dopant source or capping structure, both described more fully below, can bond and a surface that does not present a barrier to magnesium diffusion.

Figure 2:
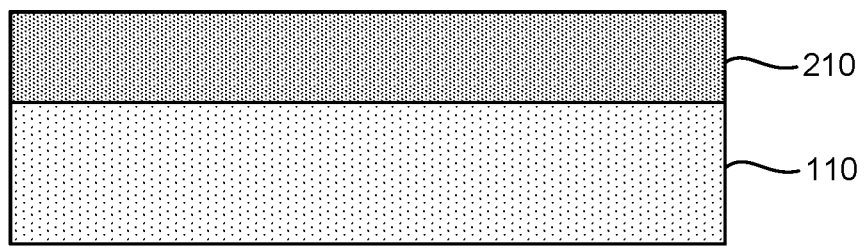
FIG. 2 is a simplified cross-sectional diagram illustrating a GaN substrate and a magnesium source according to an embodiment of the present invention.

FIG. 2 is a simplified cross-sectional diagram illustrating a GaN substrate and a magnesium source according to an embodiment of the present invention. Referring to FIG. 2, in an embodiment, the magnesium source 210 is sputtered onto the GaN substrate 110 to provide a magnesium diffusion source. According to various embodiments of the present invention, the magnesium source 210 can be a sputtered magnesium metal layer with a thickness ranging from about 1 nm to 20 nm, for example, between 5 nm and 15 nm, or a magnesium metal layer 20 nm thick; a sputtered $MgF_2$ layer with a thickness ranging from about 10 nm to 50 nm, for example, between 20 nm and 50 nm; an AlN—Mg source, which can be formed by co-sputtering AlN with Mg. The magnesium concentration in this AlN—Mg source can be >$1 \times 10^{19}$ $cm^3$ to ~10% magnesium concentration. The thickness of the AlN—Mg source can range from 10 nm to 100 nm. The AlN—Mg source can be formed by concurrently sputtering both AlN and Mg from separate sputtering sources. In other embodiments, other deposition techniques other than sputtering are used to form the magnesium source 210. One of ordinary skill in the art would recognize many variations, modifications, and alternatives.

As described more fully below, the magnesium source 210 provides a diffusion source that can be used in fabricating optical, electronic, and opto-electronic devices with doped regions formed by diffusion. It should be noted that the inventors have determined that the thin layers described above provide for enhanced magnesium diffusion. Without limiting embodiments of the present invention, the inventors believe that the thin layers (e.g., a few to a few tens of nanometers of the magnesium source, for example, a sputtered magnesium source) enable more precise control of GaN decomposition. Without limiting embodiments of the present invention, the inventors believe that as the thickness of the magnesium source 210 increases, the source layer behaves more like a bulk material, decreasing the effectiveness of the capping structure discussed more fully below.

Figure 3A:
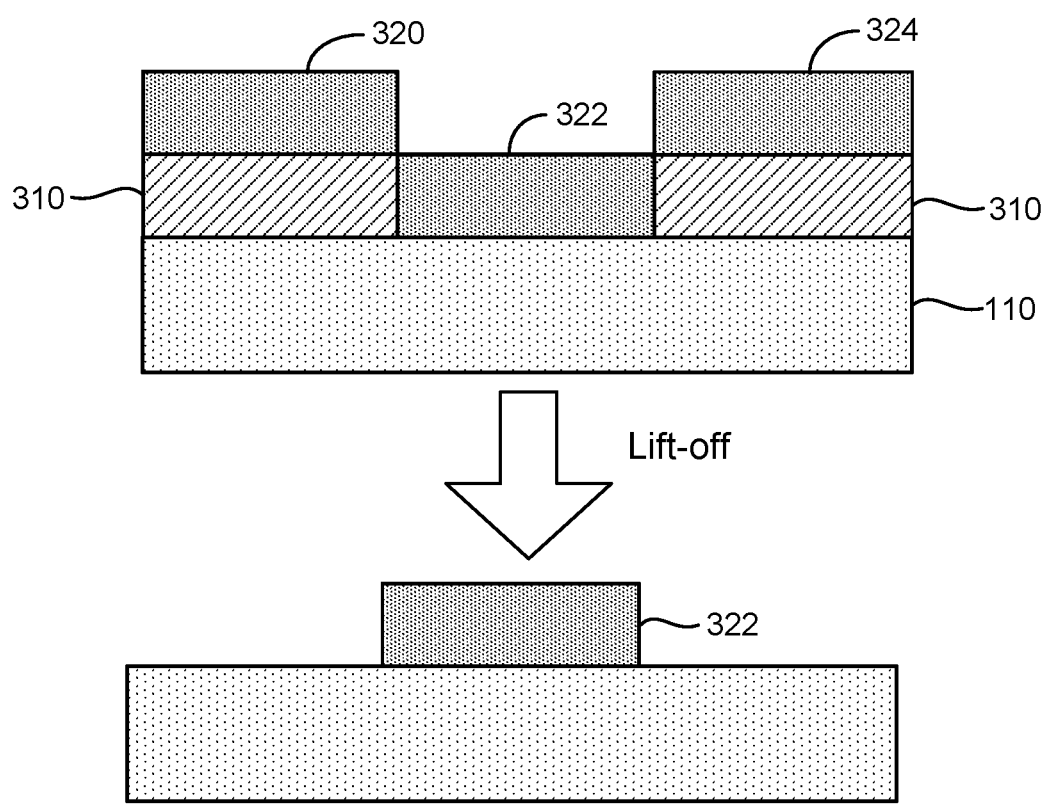
FIG. 3A is a simplified process flow for fabricating a magnesium diffusion source according to one embodiment of the present invention.
Figure 3B:
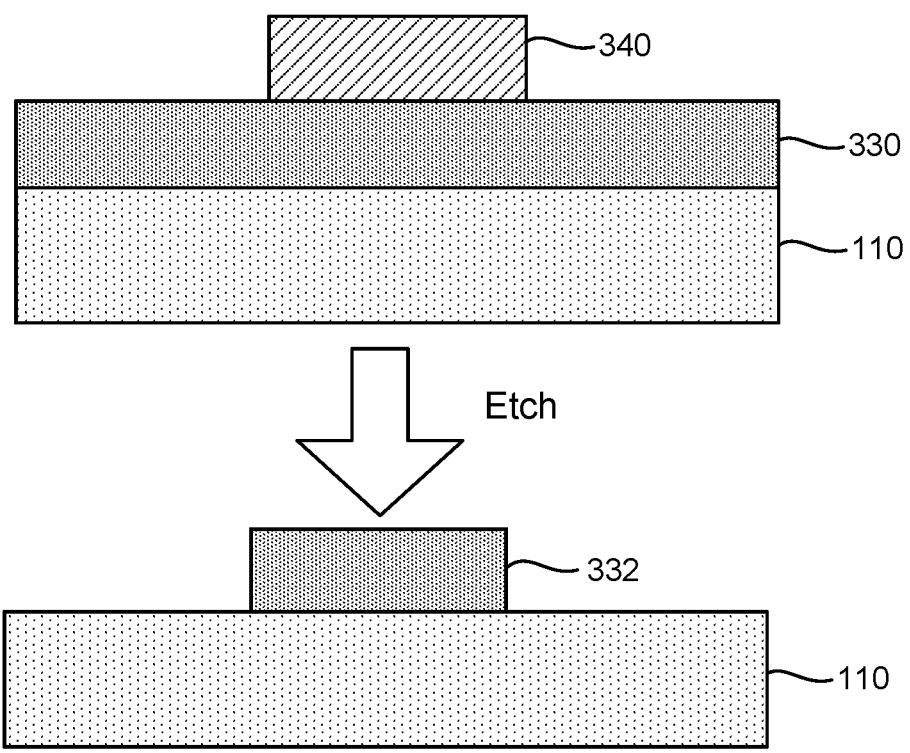
FIG. 3B is a simplified process flow for fabricating a magnesium diffusion source according to another embodiment of the present invention.

FIGS. 3A and 3B illustrate two methods of forming the magnesium source 210 illustrated in FIG. 2. The capability to provide patterned source regions enables integration into a wide variety of semiconductor device process flows.

FIG. 3A is a simplified process flow for fabricating a magnesium diffusion source according to one embodiment of the present invention. In FIG. 3A, a lift-off based source patterning process is used to form the magnesium diffusion source. A photoresist layer 310 is deposited on the GaN substrate 110 and patterned to provide one or more openings. The magnesium diffusion source, which can be one of the magnesium sources described in relation to FIG. 2, is deposited, for example, using sputtering, to form regions 320 and 324 on the photoresist layer 310 and magnesium diffusion source region 322 on the GaN substrate 110. Removal of the photoresist layer 310 and the source regions 320 and 324 on the photoresist layer 310 using a lift-off process will result in the magnesium diffusion source region 322 being formed on the GaN substrate with the desired patterning. As an example, devices that utilize doped regions can utilize this lift-off process.

Although a single magnesium diffusion source 322 is illustrated in FIG. 3A, it will be evident to one of skill in the art that multiple magnesium diffusion sources can be formed as appropriate to the particular device being fabricated. One of ordinary skill in the art would recognize many variations, modifications, and alternatives.

FIG. 3B is a simplified process flow for fabricating a magnesium diffusion source according to another embodiment of the present invention. In FIG. 3B, an etch-based source patterning process is used to form the magnesium diffusion source. In this embodiment, the magnesium diffusion source layer 330 is sputtered onto the entire or substantial portions of the GaN substrate and a photoresist layer is deposited on the sputtered source layer. The magnesium diffusion source, which can be one of the magnesium diffusion sources described in relation to FIG. 2, is sputtered to form the magnesium diffusion source layer 330 on the GaN substrate 110 that can then be subsequently patterned.

A photoresist layer is deposited and patterned to provide one or more etch mask regions 340. Using the photoresist as an etch mask, the magnesium diffusion source layer 330 is patterned to produce magnesium diffusion source region 332 on the GaN substrate with the desired patterning. It should be noted that other etch masks, including $SiN_x$, $SiO_2$, Ni, Pt, or Au, can be used in place of, or in combination with, a photoresist etch mask. The remaining photoresist is then removed. As an example, devices that utilize doped regions can utilize this etch-based process.

Although a single magnesium diffusion source region 332 is illustrated in FIG. 3A, it will be evident to one of skill in the art that multiple magnesium diffusion sources can be formed as appropriate to the particular device being fabricated. One of ordinary skill in the art would recognize many variations, modifications, and alternatives.

Figure 4:
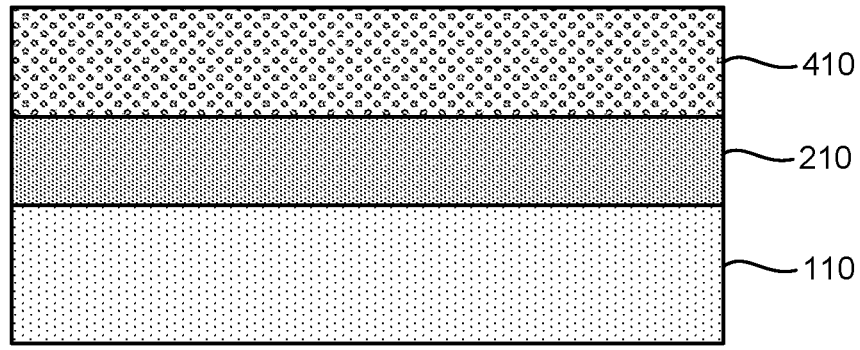
FIG. 4 is a simplified cross-sectional diagram illustrating a capped GaN substrate according to an embodiment of the present invention.

FIG. 4 is a simplified cross-sectional diagram illustrating a capped GaN substrate according to an embodiment of the present invention. Referring to FIG. 4, a capping structure 410, also referred to as a capping layer or a cap layer, is deposited over the magnesium source 210, which may be a sputtered magnesium source layer. The magnesium source 210 may be a patterned source region as described in relation to FIGS. 3A and 3B or may cover the entirety of the GaN substrate 110. The capping structure may be formed using a variety of deposition techniques and a number of different magnesium sources may be utilized in conjunction with the capping structure 410.

The materials of the capping structure can include sputtered AlN with a thickness ranging from about 100 nm to 200 nm combined with a layer of $SiO_2$, which can be PECVD deposited with a thickness ranging from about 50 nm to 200 nm. In another embodiment, the capping structure includes sputtered AlN with a thickness ranging from about 100 nm to 200 nm) combined with a layer of $SiN_x$, which can be PECVD deposited with a thickness ranging from about 20 nm to 50 nm. In dual layer capping structure designs (e.g., AlN/$SiO_2$ or AlN/$SiN_x$), the first AlN layer can serve to protect the sputtered magnesium source layer while the second $SiO_2$ or $SiN_x$ layer can serve to protect the first AlN layer. If the AlN nitride is sputtered, it can be characterized by a low density and an amorphous structure, which would make it vulnerable to oxidation and other processes. Accordingly, the dual layer capping structure designs provide protection for this first AlN layer.

In some embodiments, in order to protect the sputtered magnesium source from oxidation, the capping layer is deposited after the magnesium source is sputtered and while the sputtered magnesium source is in a vacuum environment or a non-oxidizing environment. Accordingly, a single system can be used in which the magnesium source can be sputtered followed sputtering of one or more portions of the capping layer (e.g., the first AlN layer of either the AlN/$SiO_2$ or AlN/$SiN_x$ dual layer capping structure designs), without breaking vacuum. Alternatively, multiple systems can be utilized with appropriate load locks or the like. One of ordinary skill in the art would recognize many variations, modifications, and alternatives.

In yet another embodiment, the capping layer includes pyrolized photoresist. In this embodiment, 5 μm to 20 μm of photoresist can be formed by spin coating, then pyrolized in forming gas (e.g., at a temperature of 600 to 800° C.).

In contrast with diffusion processes that are performed in a semiconductor growth reactor and do not use a capping layer because the presence of the capping layer would contaminate the growth reactor, the use of the capping layer enables protection of the underlying magnesium source during annealing. In particular, an amorphous capping layer, if introduced into a semiconductor growth reactor and exposed to temperatures suitable for diffusing the dopants into the GaN layer or substrate, would result in decomposition of the capping layer, likely resulting in re-deposition of the materials in the capping layer on the interior of the growth reactor.

The following examples illustrate how different magnesium sources, for example, sputtered magnesium sources, can be utilized with different capping structures.

Mg metal with a photoresist capping layer: In this case, the photoresist, which can have a thickness ranging from 2 μm to 10 μm, serves as the main cap. In some embodiments, in order to prevent oxidation of magnesium, the inclusion of a thin AlN layer on magnesium (e.g., with a thickness ranging from 20 nm to 50 nm) can be utilized. When used for this purpose, the AlN will generally be deposited after magnesium deposition without exposing the deposited magnesium to oxygen. This can be done, for example, by performing the deposition in the same tool/chamber or by keeping the magnesium surface in an inert gas ambient. The AlN layer can have a thickness ranging from 10 nm to 100 nm in some embodiments.

Mg metal present in $MgF_2$ with a AlN/$SiO_2$ capping structure: In this case, the AlN is deposited or sputtered as the first layer of the capping structure and the $SiO_2$ layer is formed on the AlN layer. The thickness of the AlN layer can range from 40 nm to 300 nm and the thickness of the $SiO_2$ layer can range from 20 nm to 200 nm, resulting in a thickness of the capping structure ranging from 60 nm to 500 nm. In other embodiments, different thicknesses can be utilized depending on the particular application.

Mg metal with a sputtered AlN/$SiN_x$ capping structure: In this case, it is advantageous if the magnesium metal deposition and the subsequent AlN sputtering can be done without exposing the magnesium metal to oxygen to avoid possible oxidation of the magnesium metal surface. This can be done, for example, by performing the deposition in the same tool/chamber or by keeping the magnesium metal surface in an inert gas ambient. The AlN can be deposited or sputtered as the first layer of the capping structure and the $SiN_x$ layer is formed on the AlN layer. The thickness of the AlN layer can range from 40 nm to 300 nm and the thickness of the $SiN_x$ layer can range from 20 nm to 200 nm, resulting in a thickness of the capping structure ranging from 60 nm to 500 nm. In other embodiments, different thicknesses can be utilized depending on the particular application.

$MgF_2$ with a photoresist cap: $MgF_2$ is inert with respect to exposure to air. Beyond the usual clean-room cleanliness precautions, no special precaution is typically utilized if this combination of a magnesium diffusion source and a photoresist capping layer are utilized.

$MgF_2$ with an AlN/$SiN_x$ cap: $MgF_2$ is inert with respect to exposure to air. Beyond the usual clean-room cleanliness precautions, no special precaution is typically utilized if this combination of a magnesium diffusion source and a capping structure are utilized.

$MgF_2$ can be used with a combined capping structure consisting of a stack of $MgF_2$/AlN/SiN/photoresist.

AlN co-sputtered with Mg (AlN—Mg) with a photoresist cap: AlN—Mg is known to be prone to oxidation, however, only at elevated temperatures. Beyond the usual clean-room cleanliness precautions, no special precaution is typically utilized if this combination of AlN—Mg is used as a magnesium diffusion source and a photoresist layer is used as the capping layer.

AlN—Mg with an AlN/$SiN_x$ cap: During the formation of AlN layer making up the AlN—Mg diffusion source, the sputtering of the second (e.g., undoped) AlN layer is most conveniently done in the same tool by simply turning off magnesium co-sputtering. Thus, a structure is formed on the GaN substrate 210 in the following order: Mg/AlN/AlN/$SiN_x$ or Mg/AlN/$SiN_x$.

Figure 5:
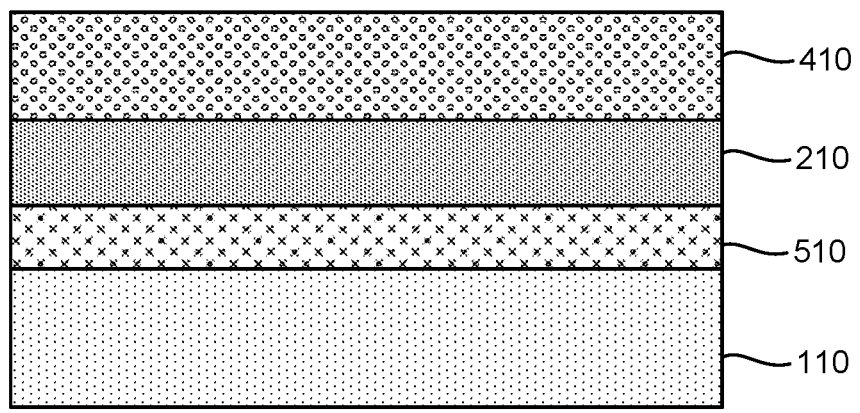
FIG. 5 is a simplified cross-sectional diagram illustrating a GaN substrate structure after an annealing process according to an embodiment of the present invention.

FIG. 5 is a simplified cross-sectional diagram illustrating a GaN substrate structure after an annealing process according to an embodiment of the present invention.

In order to form a diffusion doped Mg—GaN layer in which magnesium has diffused into and doped the GaN, the structure illustrated in FIG. 4 is annealed as illustrated in FIG. 5. Thus, FIG. 5 illustrates the structure post-anneal as including the GaN substrate 110, a magnesium doped GaN layer 510, the magnesium source 210, and the capping structure 410. As an example, an anneal can be performed, for example, in a tube furnace, at a pressure ranging from 100 Torr to 3 bars under an environment of $N_2$ or $N_2/NH_3$ or $N_2/H_2$ at temperatures ranging from 1000° C. to 1400° C., for example, between 1100° C. and 1200° C. As the temperature is increased, the diffusion rates will increase and as the diffusion time (e.g., one hour) is increased, the depth of the diffusion and the resulting thickness of the Mg—GaN layer 510 will increase.

As illustrated in FIG. 5, the p-type doped Mg—GaN layer 510 is formed by diffusion of the magnesium dopant into the GaN substrate 110, typically an undoped GaN substrate, during the annealing process shown in FIG. 5. The GaN substrate 110 can include one or more undoped or doped epitaxial layers. In the illustrated embodiment, the doped Mg—GaN layer 510, also referred to as a doped Mg—GaN region, has a thickness ranging from about 50 nm to 200 nm, for example, 75 nm to 100 nm, but this is not required by the present invention and in other embodiments, the doped Mg—GaN layer 510 is thinner or thicker as appropriate to the particular application.

Figure 6A:
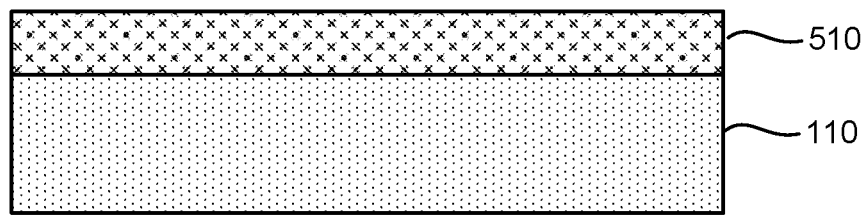
FIG. 6A is a simplified cross-sectional diagram illustrating a GaN substrate and a Mg—GaN layer according to an embodiment of the present invention.

FIG. 6A is a simplified cross-sectional diagram illustrating a GaN substrate and a Mg—GaN layer according to an embodiment of the present invention. After the anneal and diffusion process, the capping structure 410 and magnesium source 210 is removed as illustrated in FIG. 6A, resulting in the GaN substrate 210 with doped Mg—GaN layer 510. Depending on the materials present in the capping structure 410 and the magnesium source 210, different processes can be utilized. For an $AlN/SiO_2$ capping structure, a dry etch ($Cl_2$+Ar based) can be used. For an AlN/SiN capping structure, a wet etch (HF then TMAH or KOH) or a dry etch (fluorine based then chlorine based) can be used. For a photoresist capping layer, a dry etch (oxygen plasma based) can be used. A benefit provided by the wet etches and the dry etch for the pyrolized photoresist is that the etch process can be self-terminating when the Mg—GaN region is reached. One of ordinary skill in the art would recognize many variations, modifications, and alternatives.

Figure 6B:
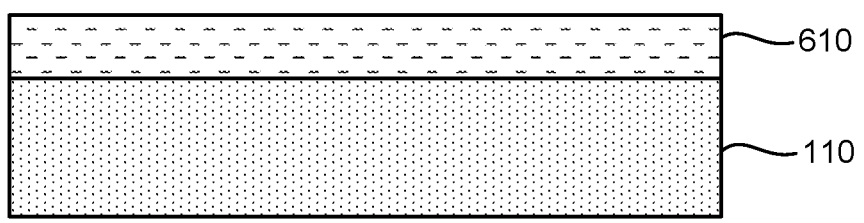
FIG. 6B is a simplified cross-sectional diagram illustrating a GaN substrate and a p-type doped GaN layer according to an embodiment of the present invention.

FIG. 6B is a simplified cross-sectional diagram illustrating a GaN substrate and a p-type doped GaN layer according to an embodiment of the present invention. Referring to FIG. 6B, activation of the magnesium dopant to form p-type doped GaN layer 610 using processing procedures that remove hydrogen from the doped Mg—GaN layer 510 is illustrated. As an example, activation at 800° C. for five minutes in a nitrogen ambient can be utilized. Using the process illustrated in FIGS. 1-2 and 4-6B, a p-type doped Mg—GaN layer 610 is provided on a GaN substrate that is suitable for fabrication of a variety of optical, electronic, and opto-electronic devices including a number of devices as described more fully below.

Figure 7:
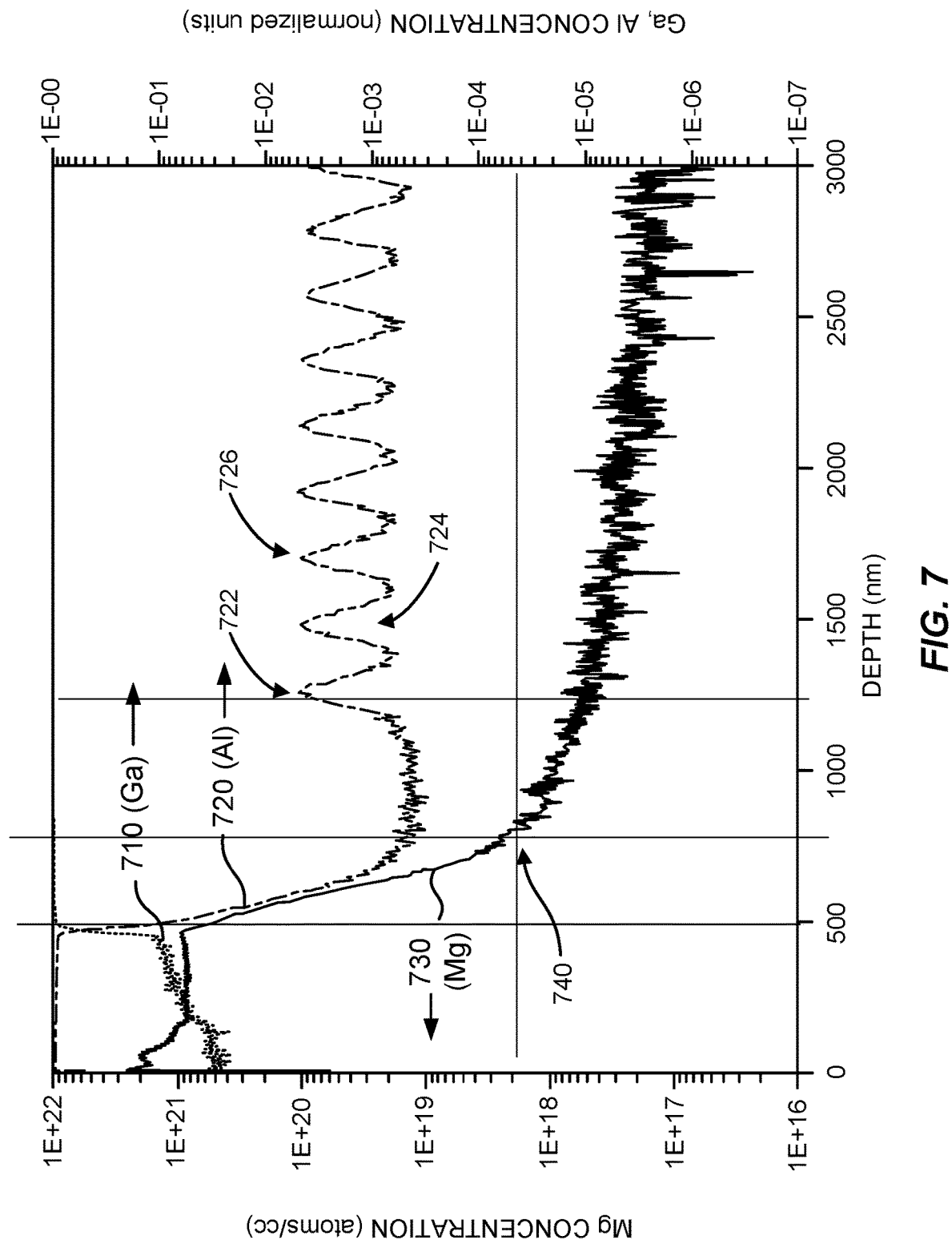
FIG. 7 is plot illustrating doping of AlGaN using magnesium according to an embodiment of the present invention.

FIG. 7 is plot illustrating doping of GaN using magnesium according to an embodiment of the present invention. As illustrated in FIG. 7, which illustrates a Secondary Ion Mass Spectrometry (SIMS) profile of the doped structure, doping of a GaN epitaxial layer with magnesium can be achieved using embodiments of the present invention. In the SIMS profile illustrated in FIG. 7, a set of AlGaN marker layers 722, 724, and 726 (as well as five additional AlGaN marker layers not labeled, but shown in FIG. 7) are utilized to characterize the diffusion depth associated with the magnesium dopants, but it will be appreciated that similar results can be achieved using a GaN epitaxial layer present on GaN substrate 110 as discussed herein. In FIG. 7, the aluminum mole fraction is plotted on the right axis in normalized units. The magnesium mole fraction or concentration is plotted on the left axis in units of atoms/$cm^3$.

The doped GaN epitaxial layer illustrated by the SIMS profile in FIG. 7 was formed using a magnesium diffusion source comprising AlN—Mg, a capping structure including a 265 nm thick layer of MN and a 100 nm layer of $SiO_2$. The GaN epitaxial layer with the magnesium diffusion source and the capping structure was annealed at 1100° C. for 1.5 hours in a process similar to that shown in FIG. 5.

In order to characterize the depth to which the magnesium dopant diffused into the GaN epitaxial layer, a set of AlGaN marker layers separated by 200 nm were formed in the GaN epitaxial layer, with the first AlGaN marker layer positioned at a depth of ~700 nm from the surface of the GaN epitaxial layer. In the plot, the surface is positioned at a depth of 500 nm.

Referring to FIG. 7, the SIMS profile demonstrates significant magnesium diffusion into the GaN epitaxial layer. At a depth of ~300 nm from the surface marked in FIG. 7 by intersection 740, the magnesium concentration is $\sim 2 \times 10^{18}$ $cm^{-3}$, providing evidence of the magnesium diffusion achieved using embodiments of the present invention.

A variety of devices, including optical, electronic, and opto-electronic devices can utilize the magnesium diffusion processes based on magnesium diffusion sources including sputtered magnesium sources. The diffusion and doped layer formation processes can be inserted into the semiconductor device fabrication process(es) at suitable points during the fabrication process(es). As an example, the methods and systems described herein can be utilized to:

Create the p-n junction to realize a p-n diode (e.g., of a power device)

Create the junction-termination-extension to realize various vertical devices (e.g., rectifier or transistor)

Create a merged-pn-Schottky diode active

Create gate-protection for a FIN-FET type device

Create the current-blocking-barrier layer for a CAVET device

Create the gate of a p-gate HEMT power device or an LJFET

In some embodiments, magnesium may diffuse laterally beyond the source area defined as illustrated in FIGS. 3A and 3B, resulting in a p-type doped region that extends laterally under other portions of the semiconductor structure. Such lateral extension usually does not occur in an ion implantation process. Although p-type doping of an undoped region is illustrated herein, other embodiments provide for p-type doping of an n-type region to reduce the doping level from a first n-type dopant density to a reduced n-type dopant density. Moreover, although p-type doping using magnesium is illustrated, other p-type dopants can be utilized. Furthermore, n-type doping using an n-type dopant can be utilized in a manner similar to the p-type doping process illustrated herein. One of ordinary skill in the art would recognize many variations, modifications, and alternatives.

FIG. 8 is a simplified schematic diagram illustrating an engineered substrate structure according to some embodiments of the present invention. As illustrated in FIG. 8, the engineered substrate structure may be suitable for a variety of electronic and optical applications. The engineered substrate structure includes a core 810 (e.g., AlN substrate) that can have a coefficient of thermal expansion (CTE) that is substantially matched to the CTE of the epitaxial material that will be grown on the engineered substrate structure, for example, on the exfoliated silicon (111) layer 825.

For applications, including the growth of gallium nitride (GaN)-based materials (epitaxial layers including GaN-based layers), the core 810 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 810 can be on the order of 100 to 1,500 µm, for example, 750 µm. The core 810 is encapsulated in an adhesion layer 812 that can be referred to as a shell or an encapsulating shell. In an embodiment, the adhesion layer 812 comprises a tetraethyl orthosilicate (TEOS) oxide layer on the order of 1,000 Å in thickness. In other embodiments, the thickness of the adhesion layer 812 varies, for example, from 100 Å to 2,000 Å. Although TEOS oxides are utilized for adhesion layers 812 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 812 completely surrounds the core 810 in some embodiments to form a fully encapsulated core 810 and can be formed using an LPCVD process or other suitable deposition processes, which can be compatible with semiconductor processing and, in particular, with polycrystalline or composite substrates and layers. The adhesion layer 812 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 810 can be utilized, the core 810 can be flipped over, and the deposition process could be repeated to coat additional portions of the core 810. Thus, although LPCVD techniques are utilized in some embodiments to provide a fully encapsulated structure, other film formation techniques can be utilized depending on the particular application.

A conductive layer 814 is formed surrounding the adhesion layer 812. In an embodiment, the conductive layer 814 is a shell of polysilicon (i.e., polycrystalline silicon) that is formed surrounding the adhesion layer 812 since polysilicon can exhibit poor adhesion to ceramic materials. In embodiments in which the conductive layer 814 is polysilicon, the thickness of the polysilicon layer can be on the order of 500-5,000 Å, for example, 2,500 Å. In some embodiments, the polysilicon layer can be formed as a shell to completely surround the adhesion layer 812 (e.g., a TEOS oxide layer), thereby forming a fully encapsulated adhesion layer 812, and can be formed using an LPCVD process. In other embodiments, as discussed below, the conductive material can be formed on a portion of the adhesion layer 812, for example, a lower half of the substrate structure. In some embodiments, conductive material can be formed as a fully encapsulating layer and subsequently removed on one side of the substrate structure.

In an embodiment, the conductive layer 814 can be a polysilicon layer doped to provide a highly conductive material, for example, doped with boron to provide a p-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^{-3}$) can be utilized to provide either n-type or p-type semiconductor materials suitable for use in the conductive layer 814. One of ordinary skill in the art would recognize many variations, modifications, and alternatives.

The presence of the conductive layer 814 is useful during electrostatic chucking of the engineered substrate to semiconductor processing tools, for example, tools with electrostatic chucks (ESC or e-chuck). The conductive layer enables rapid dechucking after processing in the semiconductor processing tools. In embodiments of the present invention, the conductive layer 814 enables electrical contact with the chuck or capacitive coupling to the e-chuck during future processing, including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 816 (e.g., a TEOS oxide layer on the order of 1,000 Å in thickness) is formed surrounding the conductive layer 814. The second adhesion layer 816 completely surrounds the conductive layer 814 in some embodiments to form a fully encapsulated structure and can be formed using an LPCVD process, a CVD process, or any other suitable deposition process, including the deposition of a spin-on dielectric.

A barrier layer 818, for example, a silicon nitride layer, is formed surrounding the second adhesion layer 816. In an embodiment, the barrier layer 818 is a silicon nitride layer that is on the order of 2,000 Å to 5,000 Å in thickness. The barrier layer 818 completely surrounds the second adhesion layer 816 in some embodiments to form a fully encapsulated structure and can be formed using an LPCVD process. In addition to silicon nitride layers, amorphous materials, including SiCN, SiON, AlN, SiC, and the like can be utilized as barrier layers 818. In some implementations, the barrier layer 818 consists of a number of sub-layers that are built up to form the barrier layer 818. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 818, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 818 into the engineered substrate structure to prevent this undesirable diffusion.

A bonding layer 820 (e.g., a silicon oxide layer) is deposited on a portion of the barrier layer 818, for example, the top surface of the barrier layer 818, and subsequently used during the bonding of a substantially single crystal layer 825 (e.g., a single crystal silicon layer such as the exfoliated silicon (111) layer illustrated in FIG. 1). The bonding layer 820 can be approximately 1.5 µm in thickness in some embodiments. In some embodiments, the thickness of the bonding layer 820 is 20 nm or more for bond-induced void mitigation. In some embodiments, the thickness of the bonding layer 820 is in the range of 0.75-1.5 µm.

The substantially single crystal layer 825 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer 825 includes a single crystal silicon layer that is attached to the bonding layer 820 using a layer transfer process.

Additional description related to the engineered substrate structure is provided in U.S. Pat. No. 10,297,445, filed on Jun. 13, 2017, and U.S. Pat. No. 10,134,589, filed on Jun. 13, 2017, the disclosures of which are hereby incorporated by reference in their entirety for all purposes. Although FIG. 8 provides an example of an engineered substrate that can be used during epitaxial growth in some embodiments, it will be appreciated that other substrates can be utilized as discussed in relation to FIG. 1.

Figure 9:
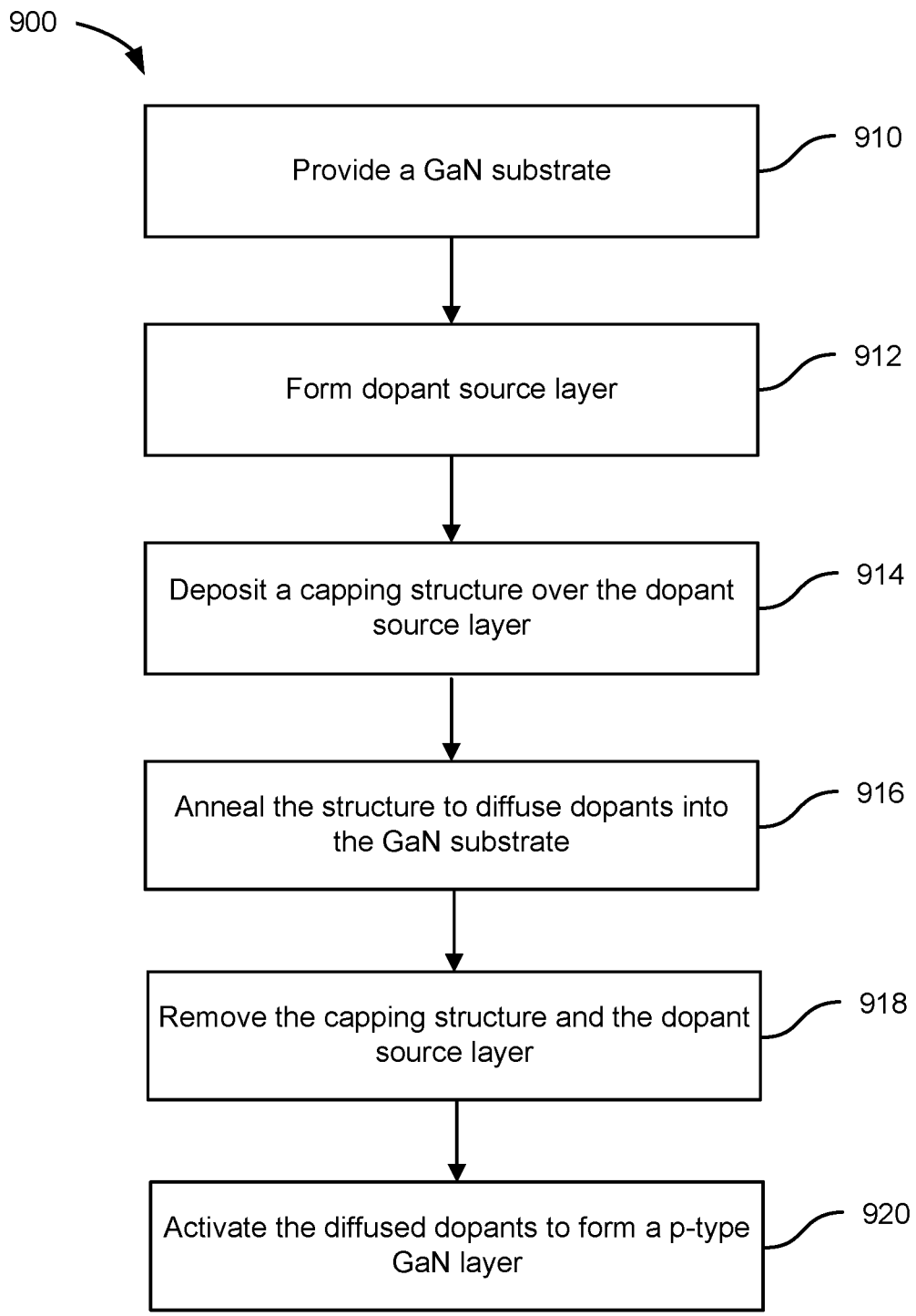
FIG. 9 is a simplified flowchart illustrating a method of forming a p-type GaN layer according to an embodiment of the present invention.

FIG. 9 is a simplified flowchart illustrating a method of forming a doped GaN layer according to an embodiment of the present invention. In a particular embodiment, the doped GaN layer is a p-type layer doped with magnesium. The method 900 includes providing a substrate structure, including a gallium nitride layer (910). The gallium nitride layer can be initially undoped or doped depending on the particular application. In some embodiments, the gallium nitride layer is a component of a GaN substrate. In other embodiments, the gallium nitride layer is mechanically coupled to an engineered substrate. As an example, the substrate structure can include an engineered substrate structure, including a polycrystalline ceramic core, a barrier layer encapsulating the polycrystalline ceramic core, a bonding layer coupled to the barrier layer, and a substantially single crystalline layer coupled to the bonding layer.

The method also includes forming a dopant source layer over the gallium nitride layer (912), for example, by sputtering a dopant source layer over the GaN layer, and depositing a capping structure over the dopant source layer (914). The dopant source layer can include magnesium metal having a thickness ranging from 5 nm to 20 nm. Alternatively, the dopant source layer can include a magnesium fluoride layer having a thickness ranging from 5 nm to 50 nm. Also, the dopant source layer can include an aluminum nitride magnesium composite material having a thickness ranging from 10 nm to 50 nm. In this case, the magnesium concentration in the aluminum nitride magnesium composite material can range from $1 \times 10^{19}$ cm$^3$ to 10%. In addition to these dopant sources, the variety of dopant sources discussed herein can be utilized, including AlN—Mg and AlN—MgF$_2$ dopant sources.

In some embodiments, prior to forming the dopant source layer, for example, by sputtering, the method can include performing a surface preparation process. The surface preparation process can include one or more or all of the following: an organic clean process; a metallic clean process, and/or an oxide removal process.

The method further includes annealing the substrate structure to diffuse dopants into the gallium nitride layer (916), removing the capping structure and the dopant source layer (918), and activating the diffused dopants (920). As an example, annealing the substrate structure can be performed at a temperature ranging from about 1000° C. to about 1400° C.

It should be appreciated that the specific steps illustrated in FIG. 9 provide a particular method of forming a doped (e.g., p-type) GaN layer according to some embodiments of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Although GaN layers are discussed herein, the present invention is not limited to GaN and other III-V materials can be utilized, including AlGaN, InGaN, InAlGaN, combinations thereof, and the like. One of ordinary skill in the art would recognize many variations, modifications, and alternatives.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a p-type gallium nitride layer, the method comprising:
   providing a substrate structure including an epitaxial gallium nitride layer;
   sputtering a dopant source including magnesium onto the epitaxial gallium nitride layer;
   patterning the dopant source to form a patterned dopant source region and one or more openings to the epitaxial gallium nitride layer;
   depositing a dielectric capping structure over the patterned dopant source region and the one or more openings;
   thereafter, annealing the substrate structure at a temperature ranging from about 1000° C. to about 1400° C. to diffuse magnesium into the epitaxial gallium nitride layer;
   removing the dielectric capping structure and the patterned dopant source region; and
   thereafter, activating the diffused magnesium to form the p-type gallium nitride layer.

2. The method of claim 1 wherein the dopant source comprises a layer of magnesium fluoride having a thickness ranging from 20 nm to 50 nm.

3. The method of claim 1 wherein the dopant source comprises a layer of an aluminum nitride magnesium composite material having a thickness ranging from 5 nm to 50 nm.

4. The method of claim 1 wherein the substrate structure comprises:
   a polycrystalline ceramic core;
   a barrier layer encapsulating the polycrystalline ceramic core;
   a bonding layer coupled to the barrier layer; and
   a substantially single crystalline layer coupled to the bonding layer.

5. The method of claim 1 wherein the dielectric capping structure comprises AlN/SiO$_2$ or AlN/SiN.

6. A method of forming a doped gallium nitride layer, the method comprising:
   providing a substrate structure including an epitaxial gallium nitride layer;
   forming a dopant source layer over the epitaxial gallium nitride layer;
   patterning the dopant source layer to form a patterned dopant source region and one or more openings to the epitaxial gallium nitride layer;
   depositing a dielectric capping structure over the patterned dopant source region and the one or more openings;
   thereafter, annealing the substrate structure at a temperature ranging from about 1000° C. to about 1400° C. to diffuse dopants into the epitaxial gallium nitride layer;
   removing the dielectric capping structure and the patterned dopant source region; and
   thereafter, activating the diffused dopants.

7. The method of claim 6 wherein forming the dopant source layer comprises sputtering the dopant source layer over the epitaxial gallium nitride layer.

8. The method of claim 6 further comprising, prior to forming the dopant source layer, performing a surface preparation process.

9. The method of claim 8 wherein the surface preparation process comprises an organic clean process or an oxide removal process.

10. The method of claim 8 wherein the surface preparation process comprises a metallic clean process.

11. The method of claim 8 wherein the surface preparation process comprises an organic clean process, a metallic clean process, and an oxide removal process.

12. The method of claim 6 wherein the epitaxial gallium nitride layer is undoped.

13. The method of claim 6 wherein the dopant source layer comprises magnesium having a thickness ranging from 5 nm to 20 nm and the epitaxial gallium nitride layer comprises a p-type gallium nitride layer.

14. The method of claim 6 wherein the dopant source layer comprises magnesium fluoride having a thickness ranging from 20 nm to 50 nm.

15. The method of claim 6 wherein the dopant source layer comprises an aluminum nitride magnesium composite material having a thickness ranging from 5 nm to 50 nm.

16. The method of claim 15 wherein a magnesium concentration in the aluminum nitride magnesium composite material ranges from $1\times10^{19}$ cm$^3$ to 10%.

17. The method of claim 6 wherein the dielectric capping structure comprises AlN/SiO$_2$ or AlN/SiN.

18. The method of claim 6 wherein the substrate structure comprises:
   a polycrystalline ceramic core;
   a barrier layer encapsulating the polycrystalline ceramic core;
   a bonding layer coupled to the barrier layer; and
   a substantially single crystalline layer coupled to the bonding layer.

19. The method of claim 6 wherein the dielectric capping structure is operable to anneal magnesium implant damage in the substrate structure.

20. The method of claim 6 further comprising, prior to forming the dopant source layer, forming a mask on the epitaxial gallium nitride layer, wherein the mask exposes one or more portions of a top surface of the epitaxial gallium nitride layer.

* * * * *

UNITED STATES PATENT AND TRADEMARK OFFICE
CERTIFICATE OF CORRECTION

| | | |
|---|---|---|
| PATENT NO. | : 11,881,404 B2 | Page 1 of 1 |
| APPLICATION NO. | : 17/172417 | |
| DATED | : January 23, 2024 | |
| INVENTOR(S) | : Ozgur Aktas et al. | |

It is certified that error appears in the above-identified patent and that said Letters Patent is hereby corrected as shown below:

In the Specification

Column 1, Line 12, INSERT:
-- STATEMENT AS TO RIGHTS TO INVENTIONS MADE UNDER FEDERALLY SPONSORED RESEARCH AND DEVELOPMENT
This invention was made with government support under DE-AR0001040 awarded by the U.S. Department of Energy. The government has certain rights in the invention. --

Signed and Sealed this
Thirty-first Day of December, 2024

Derrick Brent
*Acting Director of the United States Patent and Trademark Office*